United States Patent
Hou et al.

(10) Patent No.: US 10,951,172 B2
(45) Date of Patent: Mar. 16, 2021

(54) LINEAR DOHERTY POWER AMPLIFIER

(71) Applicant: Telefonaktiebolaget LM Ericsson (publ), Stockholm (SE)

(72) Inventors: Rui Hou, Järfälla (SE); Lars Ridell Virtanen, Gävle (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 63 days.

(21) Appl. No.: 16/309,687

(22) PCT Filed: Jun. 28, 2016

(86) PCT No.: PCT/SE2016/050645
§ 371 (c)(1),
(2) Date: Dec. 13, 2018

(87) PCT Pub. No.: WO2018/004402
PCT Pub. Date: Jan. 4, 2018

(65) Prior Publication Data
US 2019/0140600 A1    May 9, 2019

(51) Int. Cl.
*H03F 3/68* (2006.01)
*H03F 1/02* (2006.01)
(Continued)

(52) U.S. Cl.
CPC .......... *H03F 1/0288* (2013.01); *H03F 1/301* (2013.01); *H03F 1/3205* (2013.01); *H03F 3/193* (2013.01);
(Continued)

(58) Field of Classification Search
CPC ...... H03F 1/0288; H03F 1/301; H03F 1/3205; H03F 3/193; H03F 3/211; H03F 3/245;
(Continued)

(56) References Cited

U.S. PATENT DOCUMENTS 5,786,727 A * 7/1998 Sigmon ................... H03F 3/211
                                                        330/124 R
6,737,922 B2 * 5/2004 Pengelly ............... H03F 1/0277
                                                        330/124 R
(Continued)

OTHER PUBLICATIONS

Aparin, V., et al., "Modified Derivative Superposition Method for Linearizing FET Low-Noise Amplifiers," IEEE Transactions on Microwave Theory and Techniques, vol. 53, No. 2, Feb. 2005, pp. 571-581.
(Continued)

*Primary Examiner* — Khan V Nguyen
(74) *Attorney, Agent, or Firm* — Sage Patent Group

(57) ABSTRACT

An amplifier arrangement for amplifying an input signal to an output signal for delivering to a load is disclosed. The amplifier arrangement comprises a power splitter configured to receive the input signal and produce split input signals. The amplifier arrangement further comprises a first amplifier branch comprising multiple main amplifier circuits. Output signals of the multiple main amplifier circuits are combined to generate a first output signal. The amplifier arrangement further comprises a second amplifier branch comprising at least one auxiliary amplifier circuit. The at least one auxiliary amplifier circuit is configured to receive a split input signal from the power splitter and produce a second output signal. The amplifier arrangement further comprises a power combiner configured to receive the first and second output signals and produce the output signal for delivering to the load.

4 Claims, 10 Drawing Sheets

(51) Int. Cl.
  *H03F 1/30* (2006.01)
  *H03F 1/32* (2006.01)
  *H03F 3/193* (2006.01)
  *H03F 3/21* (2006.01)
  *H03F 3/24* (2006.01)

(52) U.S. Cl.
  CPC ............. *H03F 3/211* (2013.01); *H03F 3/245* (2013.01); *H03F 2200/18* (2013.01); *H03F 2200/366* (2013.01); *H03F 2200/447* (2013.01); *H03F 2203/21131* (2013.01)

(58) Field of Classification Search
  CPC ....... H03F 2203/21131; H03F 2200/18; H03F 2200/366; H03F 2200/447; H03F 3/68; H03F 3/602; H03F 3/604; H03F 3/607; H03F 3/60
  USPC ...................................... 330/124 R, 286, 295
  See application file for complete search history.

(56) References Cited

U.S. PATENT DOCUMENTS

| | | | | |
|---|---|---|---|---|
| 8,346,189 B2* | 1/2013 | Dupuy | ................... | H03F 3/245 455/114.1 |
| 8,670,732 B2* | 3/2014 | Borodulin | ............. | H03F 1/0277 375/297 |
| 8,749,306 B2* | 6/2014 | Pengelly | ................... | H03F 1/42 330/124 R |
| 8,754,709 B2* | 6/2014 | Chen | .................... | H03F 1/0277 330/124 R |
| 9,331,638 B2* | 5/2016 | Chen | ....................... | H03F 3/211 |
| 2004/0189380 A1 | 9/2004 | Myer et al. | | |
| 2009/0295473 A1* | 12/2009 | Dupuy | ................... | H03F 3/602 330/124 R |
| 2010/0176885 A1 | 7/2010 | Kim et al. | | |
| 2011/0140775 A1 | 6/2011 | Hong et al. | | |
| 2012/0286866 A1 | 11/2012 | Khanifar et al. | | |
| 2013/0122834 A1* | 5/2013 | Cabrera | ................ | H03F 1/0277 455/114.3 |
| 2014/0077874 A1* | 3/2014 | Ahmed | ................... | H03F 3/195 330/124 R |

OTHER PUBLICATIONS

Lee, Y., et al., "Linearity-Optimized Power Tracking GaN HEMT Doherty Amplifier Using Derivative Superposition Technique for Repeater Systems," 2008 IEEE MTT-S International Microwave Symposium Digest, Atlanta, USA, 2008, pp. 427-430.

International Search Report and Written Opinion for International Patent Application No. PCT/SE2016/050645, dated Mar. 6, 2017, 12 pages.

Grebennikov, A. et al., "High-Efficiency Doherty Power Amplifiers: Historical Aspect and Modern Trends," Proceedings of the IEEE, vol. 100, No. 12, Dec. 2012, IEEE, pp. 3190-3219.

Grebennikov, A., "Linearity Improvement Techniques for Wireless Transmitters: Part 1," High Frequency Electronics, May 2009, Summit Technical Media, LLC, pp. 16-26.

Grebennikov, A., "Linearity Improvement Techniques for Wireless Transmitters: Part 2," High Frequency Electronics, Jun. 2009, Summit Technical Media, LLC, pp. 44-53.

Zhang, H. et al., "Linearization Techniques for CMOS Low Noise Amplifiers: A Tutorial," IEEE Transactions on Circuits and Systems—I: Regular Papers, vol. 58, No. 1, Jan. 2011, IEEE, pp. 22-36.

* cited by examiner

LINEAR DOHERTY POWER AMPLIFIER

This application is a 35 U.S.C. §371 national phase filing of International Application No. PCT/SE2016/050645, filed Jun. 28, 2016, the disclosure of which is incorporated herein by reference in its entirety.

TECHNICAL FIELD

Embodiments herein relate to an amplifier arrangement. Further, the embodiments relate to a transmitter, a base station, a beamforming antenna array comprising the amplifier arrangement.

BACKGROUND

In a wireless communication system, a transmitter employs power amplifiers (PA) to boost radio frequency (RF) signal power for transmission. A PA is expected to amplify input signals linearly and generate output signals with larger power but with identical characteristics to the input signals. However, in reality, PAs can never be made perfectly linear due to intrinsic nonlinearity of active devices e.g. transistors in PAs. Consequently, in reality, a PA, when amplifying signals, also generates distortion signals. Distortion signals within the signal bandwidth can cause communication data errors, whereas distortion signals outside the signal bandwidth causes interference to other radio users. Therefore, distortion signals generated from PAs has to be reduced, both for the sake of communication quality and for the compliance with specifications and regulations.

Various techniques exist to construct PAs with inherent linearity, such as Class-A bias, power back-off, harmonic manipulation or injection, and derivative superposition (DS). Particularly, a PA based on DS principle is made from multiple transistor cells in parallel but of different size and biased differently. As a result, although each transistor cell outputs non-linear current, their summation can be made more linear. The DS principle is described in V. Aparin and L. E. Larson, "Modified derivative superposition method for linearizing FET low-noise amplifiers," *IEEE Transactions on Microwave Theory and Techniques*, vol. 53, no. 2, pp. 571-581, February 2005.

Despite these possibilities to make inherently linear PAs, none of these techniques are widely used because of their low efficiency at back-off power levels, usually referred as back-off efficiency or average-power efficiency. Modern communication signals have a large peak-to-average power ratio (PAR). To enhance the average-power efficiency without compromising peak power capability, dedicated PA architectures are required, such as envelope tracking (ET), envelope elimination and restoration (EER), Chireix, also known as outphasing or Linear amplification using Nonlinear Components (LINC) and Doherty. Among these architectures, the one that is most widely used and almost universally applied in wireless infrastructures is the Doherty Power Amplifiers (DPA).

A DPA comprises of at least 2 PA branches, namely the main and the auxiliary branch. In operation, the auxiliary PA modulates the effective load impedance of the main PA in a specific pattern, hereafter referred to as Doherty load modulation, such that total efficiency is improved also at the average or back-off power level.

Doherty load modulation can be extended to more than one auxiliary PA branches, yielding either multi-way or multi-stage DPAs. The multiple auxiliary branches may have different biases. These biases can be optimally chosen to trade off efficiency for improved inherent linearity, according to the DS principle. One example of such practice is described in Yong-Sub Lee, etc., "Linearity-optimized power tracking GaN HEMT Doherty amplifier using derivative superposition technique for repeater systems", Microwave Symposium Digest, 2008 IEEE MTT-S International, Atlanta, Ga., 2008, pp. 427-430.

Since in practice, few DPAs have sufficient inherent linearity to comply with modern wireless communication regulations, various linearization techniques have to be applied to linearize DPAs, such as feedforward, feedback, cross-cancellation and pre-distortion. Among these techniques, the ones that are most widely adopted in radio base stations (RBS) are feedforward and digital pre-distortion (DPD).

In the current research for the 5th generation mobile communication networks (5G), one of the most important technologies is the use of antenna arrays, or multiple-input-multiple-output (MIMO) antennas, with digital beamforming in RBS. For the same output-power capacity, this technology divides a conventional high-power PA into hundreds of low-power ones. This massively parallel architecture brings unprecedented challenge to RF PAs with respect to efficiency and linearity.

Computation complexity of DPD does not scale down with PA power. In other words, the same power consumption of DPD may be negligible for a high power PA but may be prohibitively large for a low power PA. Consequently, the most widely used solution, i.e. the combination of complicated DPD and conventional DPA, may not be suitable to 5G digital MIMO system due to prohibitive thermal and both manufacturing and operating cost reasons. Alternative linearization techniques have their own drawbacks. For example, the critical disadvantage of feedback is the trade-off between bandwidth and stability. Cross-cancelation can only achieve a limited linearity improvement at the cost of both gain and efficiency. Feedforward also suffers from efficiency degradation due to its deeply backed-off "error amplifier" and the waste of output power in its cancellation coupler.

If a stand-alone PA is used without aforementioned linearization techniques, it faces an unavoidable compromise between average-power efficiency and linearity. On one hand, a DPA can be very efficient for high PAR signals, but not sufficient in its inherent linearity. On the other hand, inherently linear PAs, such as a Class-A PA in deep power back-off, are very inefficient for modern high PAR signals. In a compromised territory between the two extremes, optimal biasing of either multi-way or multi-stage DPA using the DS technique, e.g. above mentioned solution described by Yong-Sub Lee etc., is an intentional trade-off between inherent linearity and back-off efficiency. Either inherent linearity or back-off efficiency may be optimized, but they cannot both be optimized simultaneously.

SUMMARY

Therefore, it is an object of embodiments herein to provide a power amplifier with optimized linearity and efficiency simultaneously.

According to one aspect of embodiments herein, the object is achieved by an amplifier arrangement for amplifying an input signal to an output signal for delivering to a load. The amplifier arrangement comprises a power splitter configured to receive the input signal and produce split input signals. The amplifier arrangement further comprises a first amplifier branch comprising multiple main amplifier circuits. Each of the multiple main amplifier circuits is configured to receive one of the split input signals from the power splitter and to generate an output signal. The output signals of the multiple main amplifier circuits are combined to generate a first output signal. Each of the multiple main amplifier circuits comprises a bipolar or field-effect transistor, and a base of each bipolar transistor or a gate of each field-effect transistor is biased separately.

The amplifier arrangement further comprises a second amplifier branch comprising at least one auxiliary amplifier circuit each being selectively operable to operate in combination with the multiple main amplifier circuits. The at least one auxiliary amplifier circuit is configured to receive one of the split input signals from the power splitter and produce a second output signal.

The amplifier arrangement further comprises a power combiner configured to receive the first and second output signals and produce the output signal for delivering to the load.

The power amplifier arrangement according to the embodiments herein is a DPA and operates in the same way as a conventional DPA. However the entire DPA according to the embodiments herein comprises multiple main amplifier circuits connected in parallel to form a main PA branch, i.e. the first amplifier branch, and at least one auxiliary amplifier circuit behaves as an auxiliary PA branch. The output of the main and auxiliary PAs is combined by a power combiner, e.g. a typical Doherty combiner i.e. a quarter-wavelength transmission line. At the input side, the input power may be unevenly split to drive the main and auxiliary PAs separately. The multiple main amplifier circuits may comprise bipolar or field-effect transistors with different sizes and different gate or base bias voltages, so their combined linearity can be optimized according to the DS principle. More specifically, the transistors' size, e.g. gate periphery or emitter area, may be chosen in combination with bias voltages such that the third order derivatives of the output currents, i.e. the drain or emitter currents, from each transistor, i.e. the $3^{rd}$ order nonlinearity coefficient of a transistor, have positive and negative values depending on different bias voltages, and the positive and negative $3^{rd}$ order nonlinearity coefficient values are depending on different gate peripheries of the transistors in a field-effect transistor, or different emitter areas in a bipolar transistor. When the output current from a transistor with positive $3^{rd}$ order nonlinearity coefficient is combined with the output current from a transistor with negative $3^{rd}$ order nonlinearity coefficient and the magnitudes of the positive and negative $3^{rd}$ order nonlinearity coefficients are equalized through a relative size scaling of the combined transistors, the resulting composite $3^{rd}$ order nonlinearity coefficient, i.e. the combined nonlinearity coefficient, will be close to zero and the theoretical third order distortion will be significantly reduced. Therefore the linearity of the first output signal produced by combining currents from drains or collectors of the transistors comprised in each of the multiple main amplifier circuits is largely improved. This linearity improvement can be effective at low power levels, i.e. when the main amplifier circuits have their output voltage swings far below their voltage limits.

If input power increases further, the output voltage swings of main amplifier circuits are close to their voltage limits, leading to a compressive distortion of their output currents. This compressive distortion is compensated by the gradual switch on of the auxiliary PAs, which generates output currents with expansive distortions. If the magnitudes of the compressive distortion from the main amplifier circuits are the same as the expansive distortion from the auxiliary amplifier circuits, the combined output is free of distortion. The power of the main and auxiliary PAs is combined in a power combiner, e.g. by means of a conventional Doherty power combiner. As a result, the auxiliary PA simultaneously load-pulls all the main amplifier circuits in the main PA branch to perform Doherty load modulation. Doherty load modulation decreases the load resistances seen by each of the main amplifier circuits, allowing them to output more currents without exceeding their maximum voltage limits. In this way, Dohery load modulation extends the inherent linearity of the main PA branch from the back-off power level up to the peak power level. At the same time, the voltage swing of each main amplifier circuit within the main PA branch is close to the maximum voltage limit for efficient operation.

Therefore, embodiments herein provide an amplifier arrangement with improved inherent linearity and average-power efficiency simultaneously.

BRIEF DESCRIPTION OF THE DRAWINGS

Examples of embodiments herein are described in more detail with reference to attached drawings in which.

DETAILED DESCRIPTION

Figure 1A:
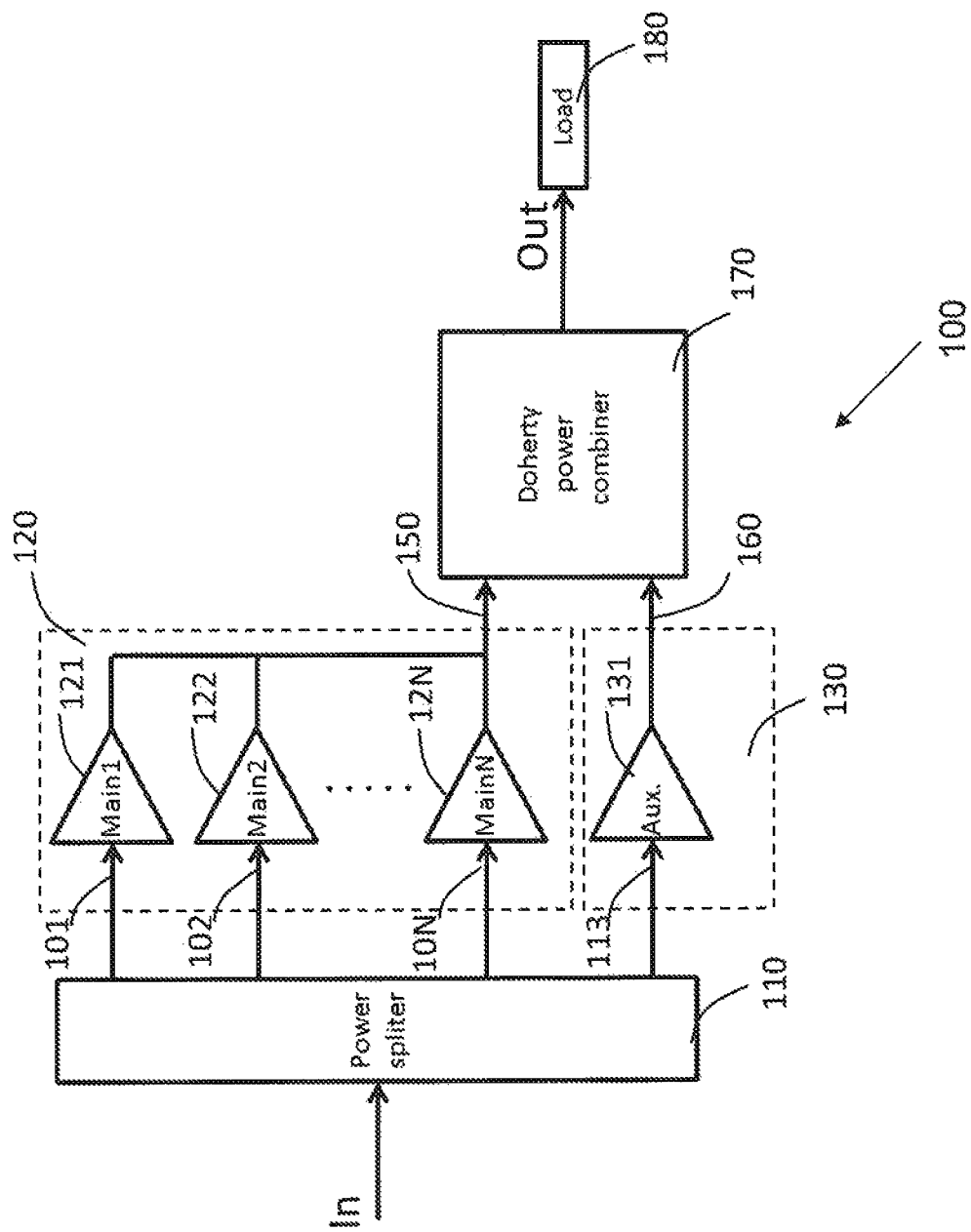
FIGS. 1a and 1b show block diagrams of amplifier arrangements according to embodiments herein.

FIG. 1a shows a block diagram of an amplifier arrangement 100 for amplifying an input signal In to an output signal Out for delivery to a load according to embodiments herein. The amplifier arrangement 100 comprises a power splitter 110 configured to receive the input signal In and produce split input signals 101, 102, . . . 10N.

The amplifier arrangement 100 further comprises a first amplifier branch 120 comprising multiple main amplifier circuits 121, 122 . . . 12N. Each of the multiple main amplifier circuits is configured to receive one of the split input signals, e.g. a first input signal 101 and a second input signal 102, from the power splitter 110 and to generate an output signal. The output signals from each of the multiple main amplifier circuits 121, 122, . . . 12N are combined to generate a first output signal 150. Each of the multiple main amplifier circuits 121, 122, . . . 12N may comprise a bipolar or field-effect transistor, and a base of each bipolar transistor or a gate of each field-effect transistor is biased separately.

The amplifier arrangement 100 further comprises a second amplifier branch 130 comprising at least one auxiliary amplifier circuit 131 each being selectively operable to operate in combination with the multiple main amplifier circuits. The at least one auxiliary amplifier circuit 131 is configured to receive one of the split input signals 113 from the power splitter 110 and produce a second output signal 160. In this case, the amplifier arrangement 100 is a 2-way DPA.

The amplifier arrangement 100 further comprises a power combiner 170 configured to receive the first and second output signals 150, 160 and produce the output signal Out for delivering to the load 180.

Figure 1B:
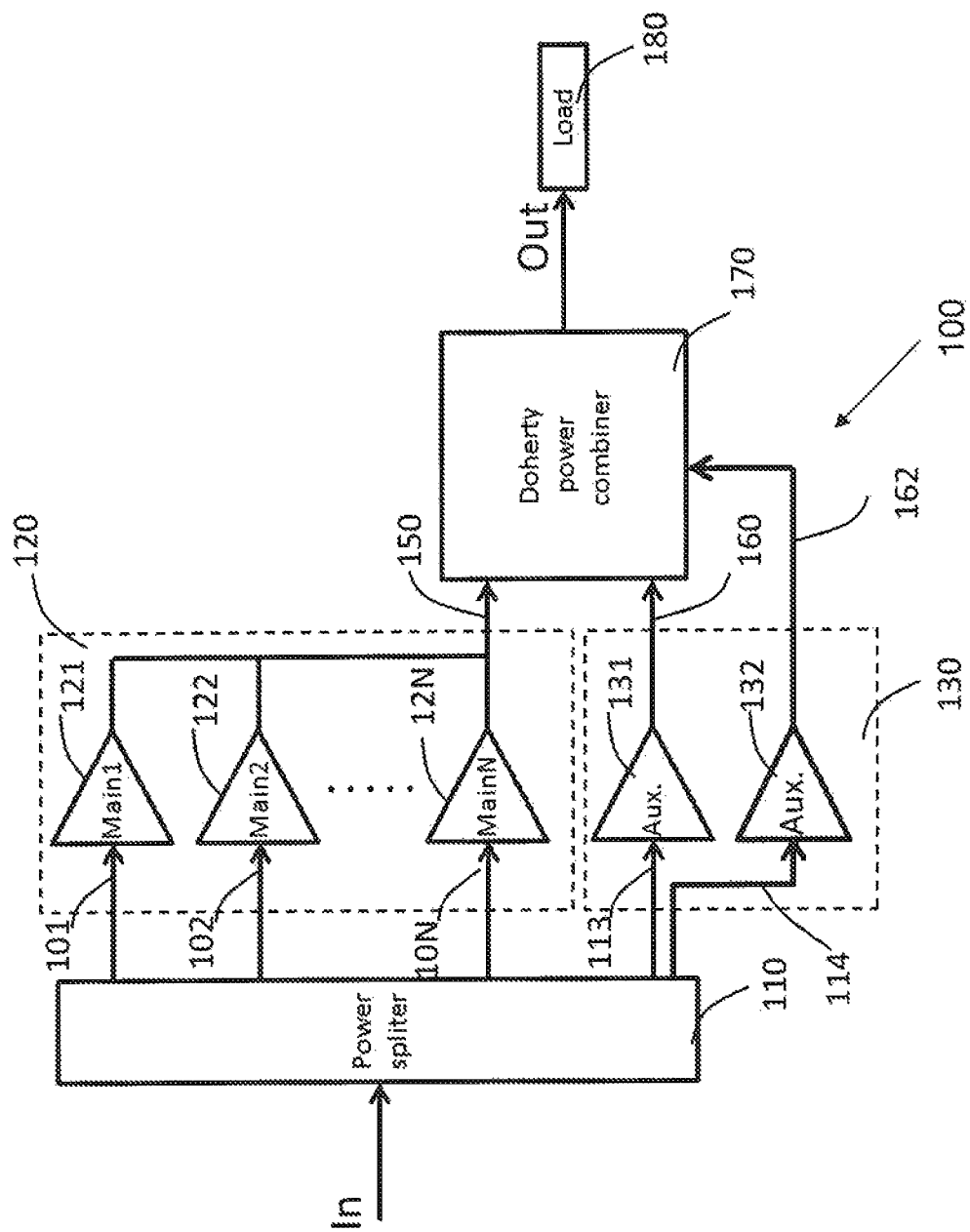

According to some embodiments, the second amplifier branch 130 may further comprise a second auxiliary amplifier circuit 132 configured to receive one of the split input signals 114 from the power splitter 110 and produce a third output signal 162. This embodiment is shown in FIG. 1b. In this case, the amplifier arrangement 100 is a 3-way DPA. Then the power splitter 110 may be an N+2 splitter to generate N+2 input signals, where N input signals 101, 102, . . . 10N for the multiple N of the main amplifier circuits 121, 122, . . . 12N, and 2 input signals 113, 114 for two auxiliary amplifier circuits 131, 132.

The excitation of the main and auxiliary amplifier circuits in the amplifier arrangement 100 follows a switch on sequence similar to conventional DPAs based on the input signal level. When the input signal is in a first power range, the first amplifier branch 120, i.e. the main amplifier circuits 121, 122, . . . 12N are operating by applying a driven signal.

When the input signal is in a second power range, the first auxiliary amplifier circuit 131 starts to operate in combination with the main amplifier circuits 121, 122 . . . 12N.

When the input signal is in a third power range, the second auxiliary amplifier circuit 132 starts to operate in combination with the main amplifier circuits 121, 122 . . . 12N and the first auxiliary amplifier circuit 131.

Therefore, according to some embodiments, the power splitter 110 may be configured to unevenly split power of the input signal to produce separate input signals with different power to the main amplifier circuits 121, 122 . . . 12N and the auxiliary amplifier circuits 131, 132.

As shown in FIGS. 1a and 1b, each of the multiple main amplifier circuits 121, 122, . . . 12N may be driven by a different input signal, i.e. be configured to receive a different input signal 101, 102, . . . 10N from the power splitter 110.

However, according to some embodiments, each of the multiple main amplifier circuits 121, 122 . . . 12N may be driven by a same input signal, i.e. be configured to receive a same input signal from the power splitter 110. For example, the first, second and the N-th input signals 101, 102, . . . 10N are the same.

According to some embodiments herein, the power combiner 170 may be a quarter-wavelength transmission line, the same as that used in a conventional DPA. Alternatively, the power combiner 170 may also be implemented as a hybrid coupler, according to US 2004/0189380 A1. Example implementations of hybrid couplers may be any of a 3-dB quadrature hybrid combiner, a Branch-line coupler, a lumped elements coupler, a coupled-line coupler or a Lange coupler. For example, Branch-line coupler is made from 4 pieces of Transmission Lines (TL). Coupled-line coupler is made from 2 pieces of mutually coupled TLs. Lumped element coupler is made from inductors and capacitors. Lange couplers are made from interleaved multiple sections of coupled TLs. That means any Doherty power combiner may be used to combine the output signals from the the main amplifier circuits 121, 122 . . . 12N and the auxiliary amplifier circuits 131, 132.

The objective of the amplifier arrangement 100 is to simultaneously achieve inherent linearity and average-power efficiency. More specifically, the achievable average-power efficiency is comparative to a conventional Doherty PA. As shown in FIG. 1a, outputs of the multiple main amplifier circuits 121, 122 . . . 12N are connected together to generate the first output signal 150. That is the multiple main amplifier circuits 121, 122 . . . 12N are connected in parallel, the power combination of the main amplifier circuits is achieved by means of current summation. The power of the first amplifier branch 120 is further combined with the power of the auxiliary amplifier circuit 131 by means of e.g. a conventional Doherty power combiner, such as a quarter wavelength transmission line. As a result, the auxiliary amplifier circuit 131 simultaneously load-pulls all the main amplifier circuits 121, 122 . . . 12N in the first amplifier branch 120 to perform Doherty load modulation. Therefore the amplifier arrangement 100 is a DPA and operates in the same way as a conventional DPA. The second amplifier branch 130 modulates the effective load impedance of the first amplifier branch 120, such that total efficiency is improved also at the average or back-off power level.

The achievable inherent linearity of the amplifier arrangement 100 is comparative to a Class-A PA in power back-off. This will be explained and proved by simulations as described in the following.

Figure 2:
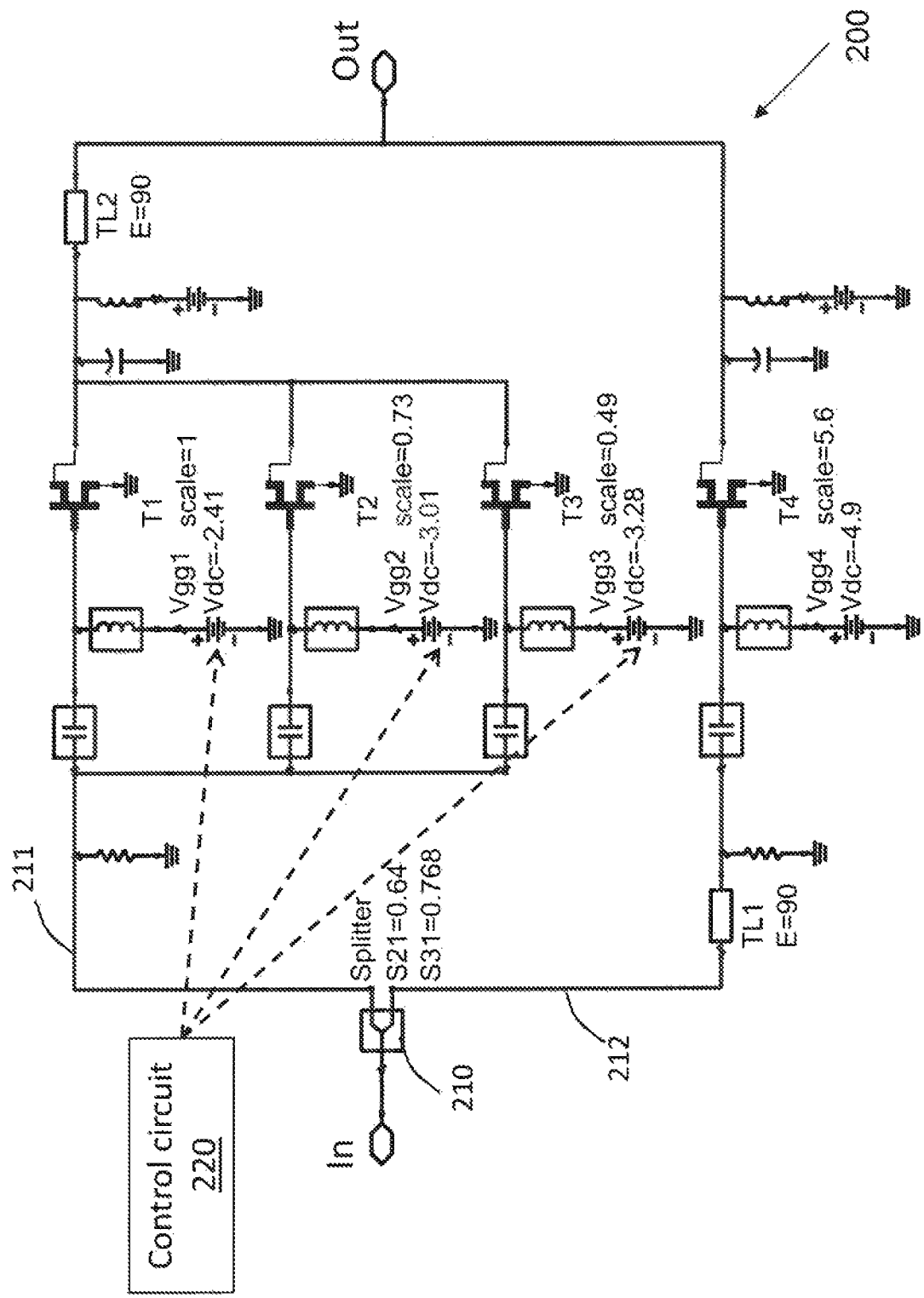
FIG. 2 is a schematic block diagram illustrating an amplifier arrangement according to an embodiment herein.

A circuit implementation of the amplifier arrangement 100 according to one embodiment is illustrated schematically in FIG. 2, denoted as an amplifier arrangement 200. According to this embodiment, the amplifier arrangement 200 comprises three main amplifier circuits and one auxiliary amplifier circuit which may be implemented by transistors T1, T2, T3, T4 respectively. T1, T2, T3, T4 may be any of a high electron mobility transistor (HEMT), a heterojunction bipolar transistor (HBT) or a laterally-defused metal-oxide-semiconductor (LDMOS) transistor. These transistors may be made of semiconductor materials from any of Gallium nitride (GaN), Silicon (Si), Gallium arsenide (GaAs) or Indium phosphide (InP).

Thus, the amplifier arrangement 200 comprises 4 transistors T1, T2, T3, T4, of which T1, T2, T3 are connected in parallel to form the main PA whereas the 4th transistor T4 behaves as the auxiliary PA. The output of the main and auxiliary PAs is combined by a typical Doherty power combiner, i.e. a quarter-wavelength transmission line TL2. At the input side, the input signal In is unevenly split by a splitter 210 to two separate input signals 211, 212, one drive the main PA, i.e. each of T1, T2, T3 is driven by the same input signal, and another one drive the auxiliary PA, T4. The 4 transistors have different sizes, i.e. different gate periphery, and different gate bias voltages, so their combined linearity can be optimized according to the DS principle. In this particular embodiment, the power capacity ratio between the aggregated main and the auxiliary PA is approximately 1:2. Consequently, its efficiency-power performance should be comparable to a conventional 1:2 asymmetrical 2-way DPA. The power capacity of a field-effect transistor is proportional to its gate periphery. The power capacity of a bipolar transistor is proportional to its emitter area.

According to some embodiments, the amplifier arrangement 200 further comprises a bias control circuit 220, as shown in FIG. 2, configured to adapt bias voltages for the transistors T1, T2, T3 comprised in the multiple main amplifier circuits based on temperature.

Due to temperature dependent electron mobility in semiconductor materials, the output current of a transistor for a certain input voltage depends on temperature. Therefore, the optimal bias voltages for the main amplifier circuits 121, 122, ..., 12N also depend on temperature. Such optimized bias voltages at different temperatures may be stored in a lookup table and regularly updated according to temperature measurement. The bias control circuit 220 may be configured to detect temperature, look up bias voltages from the lookup table based on detected temperature, then adjust the bias voltages for the main amplifier circuits 121, 122, ..., 12N to the looked up bias voltages.

Figure 3:
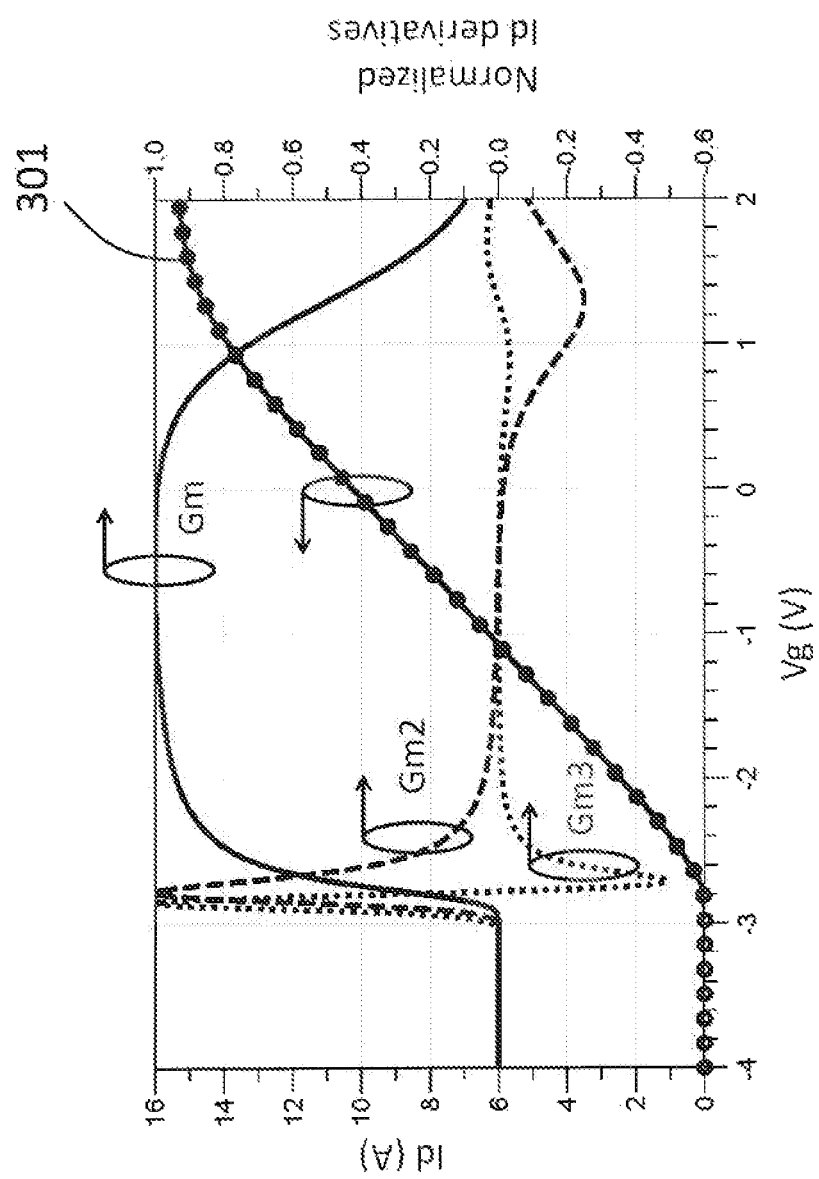
FIG. 3 is a diagram illustrating non-linear Id-Vg relationship in a transistor.
Figure 4:
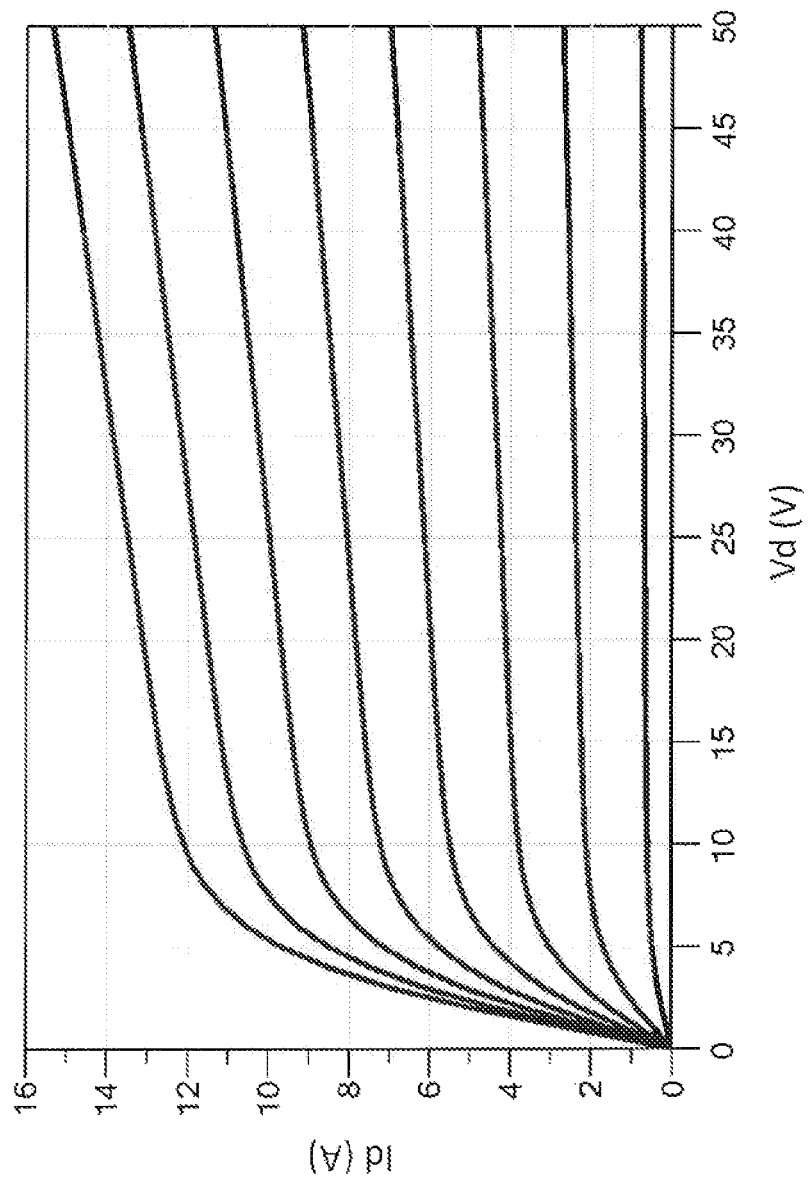
FIG. 4 is a diagram illustrating the non-linear Id-Vd relationship at different gate biasing conditions.

To verify the inherent linearity of the amplifier arrangement 200, realistic non-linear transistor models are used. In the proposed design shown in FIG. 2, the non-linear transistor model is based on a GaN HEMT. The unit-scale transistor i.e. scale=1, has 120 W output power capacity in Class B loading condition. Within the model, the drain current (Id) is a non-linear function of both the gate and the drain voltage, i.e. Vg and Vd, respectively. The non-linear Id-Vg relationship, i.e. the Id-Vg curve 301, is plotted in FIG. 3. The first order derivative of drain current Id verses gate voltage Vg, i.e. the small-signal transconductance $$Gm = \frac{\partial Id}{\partial Vg},$$

and the second order, the 3rd order derivatives of drain current Id verses gate voltage Vg, i.e., $$Gm2 = \frac{1}{2}\frac{\partial^2 Id}{\partial^2 Vg}, Gm3 = \frac{1}{6}\frac{\partial^3 Id}{\partial^3 Vg},$$

are also plotted, marked with Gm, Gm2, Gm3 in FIG. 3. The non-linear Id-Vd relationship is plotted in FIG. 4 at different gate biasing conditions. As such, practical non-linearity in typical RF and microwave power transistors is correctly included into the transistor model. The higher order coefficients e.g. Gm2, Gm3 define the strengths of the corresponding nonlinearities. Among these coefficients, Gm3 is particularly important because it controls the third-order intermodulation distortion (IM3) at low signal levels and thus determines the non-linearity of the transistors T1, T2, T3.

As can be seen from curve Gm3 in FIG. 3, the dependence of Gm3 on Vg is such that it changes from positive values to negative values when Vg transitions from −3 V to −2.8V. This phenomenon may be used to linearize the first amplifier branch 120 which comprises multiple main amplifier circuits 121, 122, ..., 12N and in this case, N=3, i.e. the transistors T1, T2, T3. That is their combined linearity can be optimized according to the DS principle.

The value or magnitude of the coefficients Gm, Gm2, Gm3 are depending on the gate peripheries of the transistors T1, T2, T3. Therefore the gate peripheries of the transistors T1, T2, T3 may be chosen in combination with their respective bias voltages such that the $3^{rd}$ order nonlinearity coefficients Gm3 of the transistors T1, T2 and T3, have positive or negative values. When the output currents from transistors with positive Gm3 are combined with the output currents from transistors with negative Gm3, and the magnitudes of positive Gm3 are equalized with the magnitudes of negative Gm3 through a relative size scaling of the combined transistors T1, T2, T3, the resulting composite Gm3, i.e. the combined nonlinearity coefficient, will be close to zero and the theoretical third order distortion will be significantly reduced. For example, the scales of T1, T2, T3 are 1, 0.73 and 0.49, respectively, and the gate bias voltages are −2.41 V, −3.01 V and −3.28 V respectively, as shown in FIG. 2.

Therefore the linearity of the first output signal 150 produced by combining currents from drains of the transistors T1, T2, T3 comprised in each of the multiple main amplifier circuits is largely improved.

Therefore, emitter areas of the bipolar transistors comprised in the multiple main amplifier circuits 121, 122, ..., 12N or gate peripheries of the field-effect transistors T1, T2, T3 comprised in the multiple main amplifier circuits 121, 122, ..., 12N may be configured in combination with their respective base or gate bias voltages such that a combined nonlinearity coefficient of the transistors T1, T2, T3 comprised in the multiple main amplifier circuits 121, 122, ..., 12N is minimized.

The linearity enhancement by the combination of the transistors T1, T2 and T3 is effective in low power levels, that is, when the main amplifier circuits have their output voltage swings far below their voltage limits. If input signal power increases further, the output voltage swings of the main amplifier circuits, i.e. transistors T1, T2 and T3, are close to their voltage limits, leading to a compressive distortion of their output currents. This compressive distortion is compensated by the gradual switch on of the auxiliary amplifier circuit, i.e. transistor T4, which generates output currents with expansive distortions. If the magnitudes of the compressive distortion from the main amplifier circuits are the same as the expansive distortion from the auxiliary amplifier circuits, the combined output is free of distortion. The power of the main and auxiliary amplifier circuits is combined in a power combiner, e.g. by means of a conventional Doherty power combiner. As a result, the auxiliary amplifier circuit 131 simultaneously load-pulls all the main amplifier circuits 121, 122, ..., 12N in the first amplifier branch 120 to perform Doherty load modulation. Doherty load modulation decreases the load resistances seen by each of the main amplifier circuits, allowing them to output more currents without exceeding their maximum voltage limits. In this way, Doherty load modulation extends the inherent linearity of the first amplifier branch 120 from the back-off power level up to the peak power level. At the same time, the voltage swing of each main amplifier circuit 121, 122, ..., 12N within the first amplifier branch 120 is close to the maximum voltage limit for efficient operation. Therefore, the embodiments herein provide an amplifier arrangement 100, 200 with improved inherent linearity and average-power efficiency simultaneously.

Figure 5:
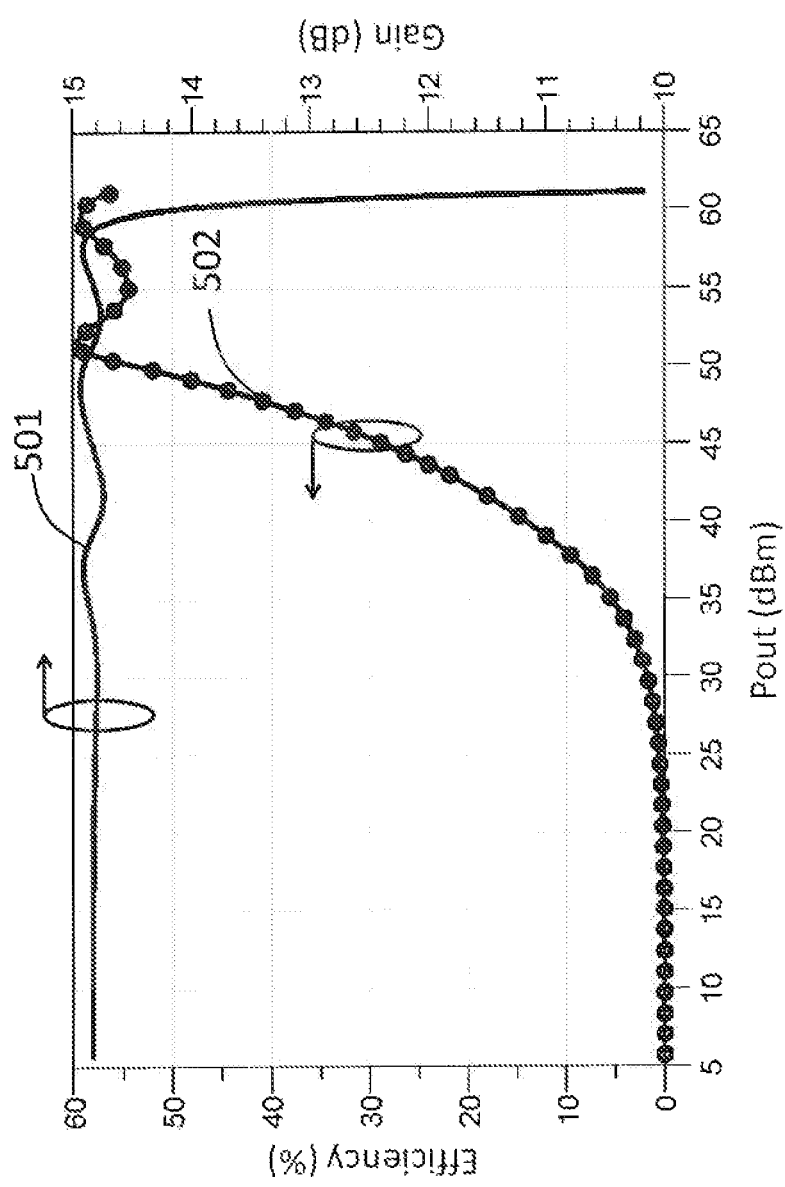
FIG. 5 is a diagram illustrating power gain and drain efficiency of an amplifier arrangement according to embodiments herein.

The effectiveness of the proposed technique is verified in a circuit simulator, Keysight Advanced Design System (ADS), by means of harmonic balance (HB) simulation. A single-tone continuous wave (CW) HB simulation is performed. The resulting power gain and drain efficiency is plotted in FIG. 5, denoted as 501, 502 respectively. It is observed from the figure, that the gain is uncommonly flat over the entire power range despite small ripples. Furthermore, the efficiency peaks appear at both the peak power, i.e. at 60 dBm output power, and at 9 dB power back-off, i.e. at 51 dBm output power, which is the same as a 1:2 asymmetrical DPA. As such, it is evident that the efficiency performance of the proposed technique is comparable to a typical DPA.

Figure 6:
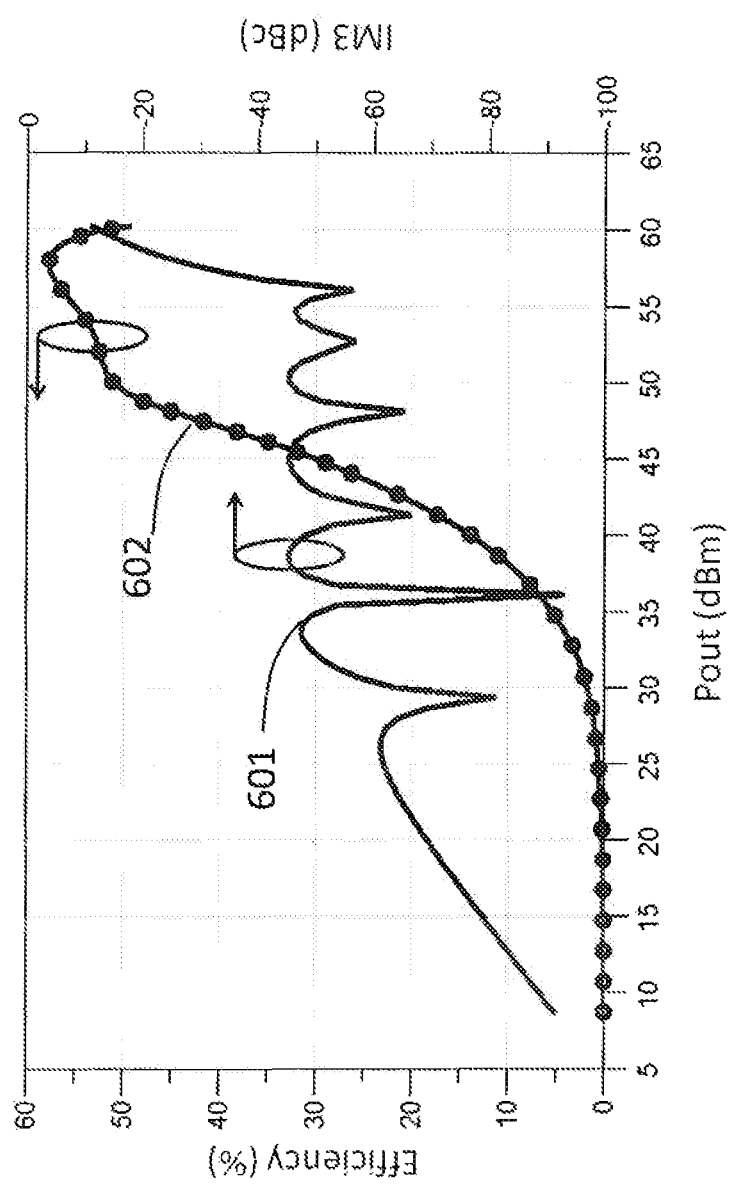
FIG. 6 is a diagram illustrating a 2-tone simulation result of an amplifier arrangement according to embodiments herein.
Figure 7:
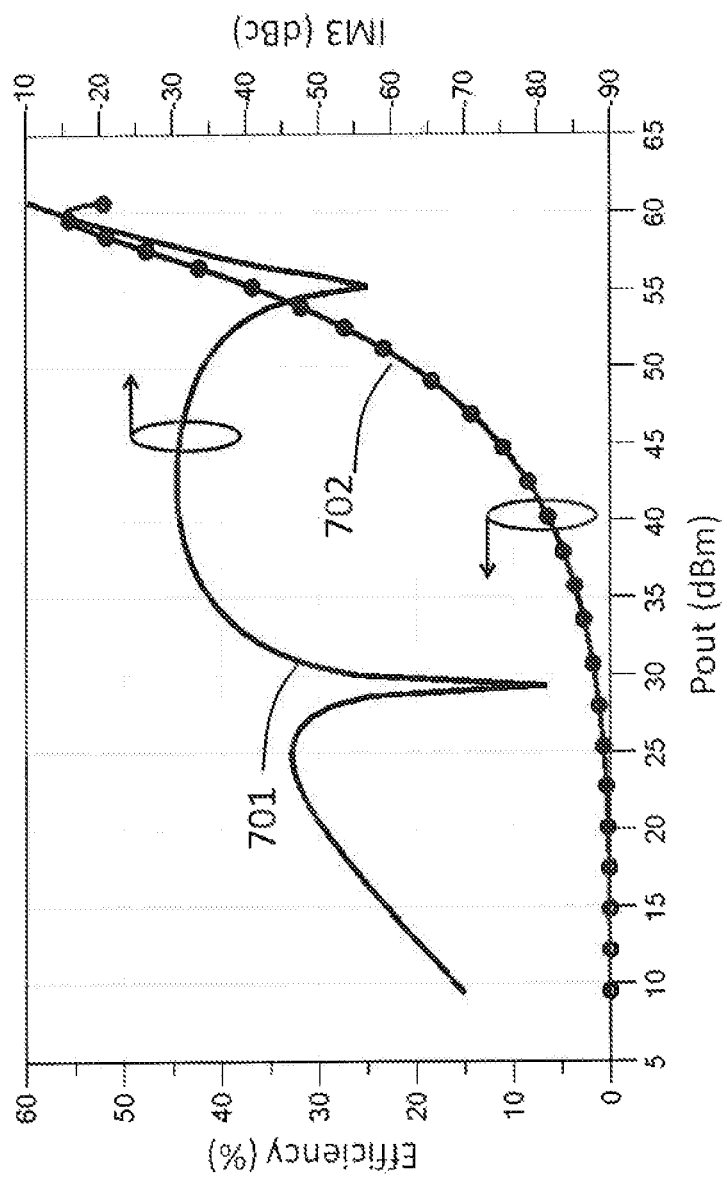
FIG. 7 is a diagram illustrating a simulation result of a Class B single-stage PA.

Advantages of the proposed technique are more evident in a 2-tone simulation result shown in FIG. 6. As can be observed, the 3rd order intermodulation product (IM3), curve 601, is strictly controlled to be below −45 dBc over the entire operating power range up to 57 dBm. At the same time, the drain efficiency, curve 602, is boosted beyond 50% in the output power range from 49 to 57 dBm. This performance is contrasted sharply with that of a Class B single-stage PA made from the same device and power capability. FIG. 7 shows the performance of such Class B single-stage PA. As observed from FIG. 7, despite an optimal gate bias, the Class B PA cannot suppress IM3 below −30 dBc for most of the power range, see curve 701. Furthermore, the drain efficiency at 50 dBm output power is merely 20%, see curve 702.

Figure 8:
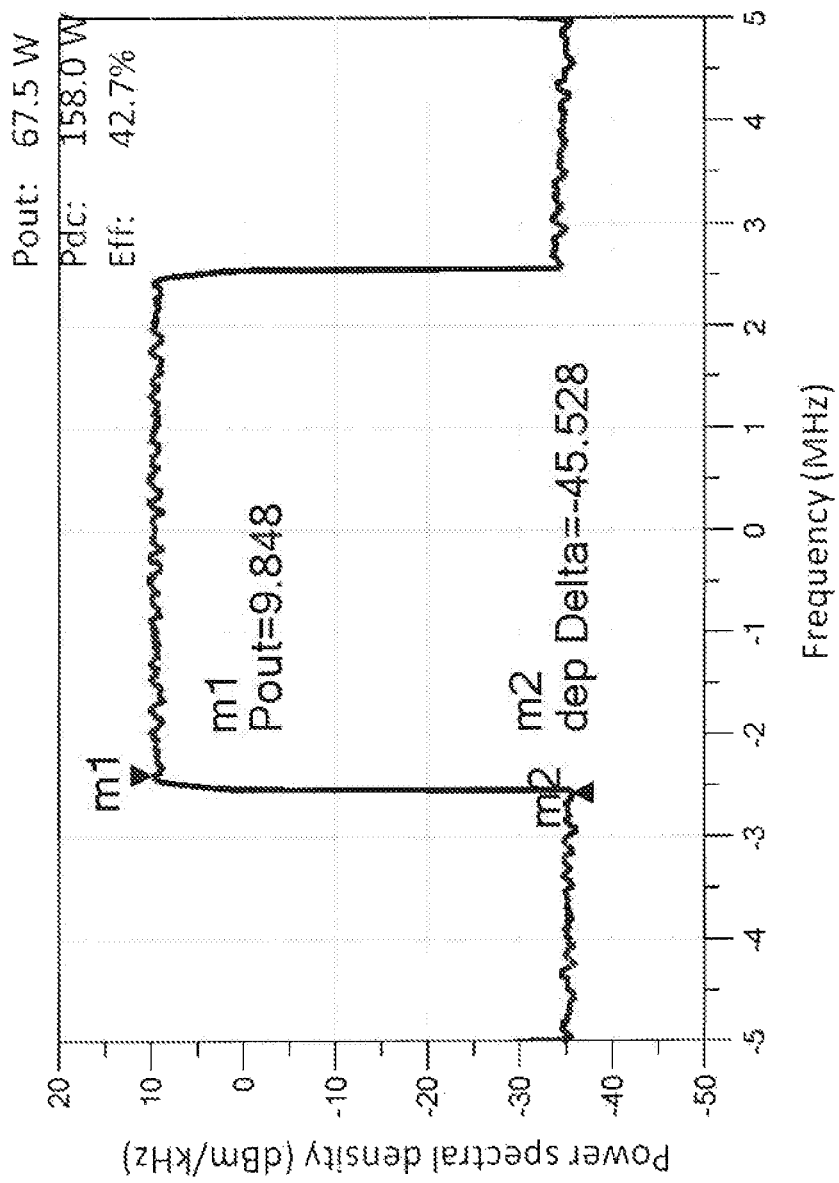
FIG. 8 is a diagram illustrating output power spectrum of an amplifier arrangement according to embodiments herein.

The ultimate performance verification is the output power spectrum plotted in FIG. 8. This result comes from an envelope simulation in ADS with an excitation of 5 MHz LTE signal. The LTE signal is unclipped, with a PAR of 10 dB at 0.01% probability. As can be observed from FIG. 8, good linearity, e.g. adjacent channel power ratio (ACPR) is −45 dBc, i.e. the power difference between marker m1 and m2, shown as Delta=−45.528 in FIG. 8, and drain efficiency of 42.7% are simultaneously obtained.

In conclusion, the effectiveness of the proposed technique as a super-linear Doherty PA is accordingly verified. To a person skilled in the art, the proposed technique can be readily applied to various embodiments. Examples include multi-way and multi-branch DPAs with hybrid or lumped power combiners.

Figure 9:
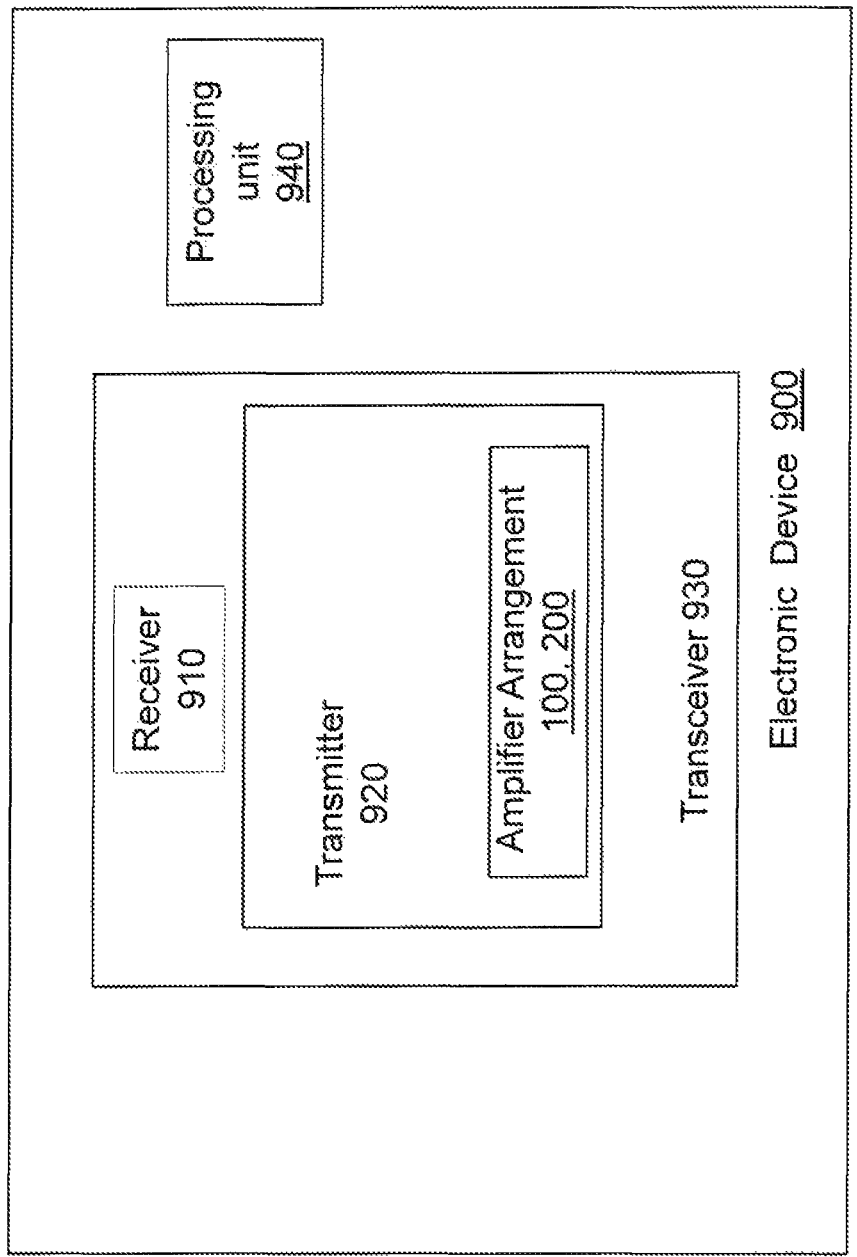
FIG. 9 is a block diagram illustrating an electronic device in which embodiments herein may be implemented.

The amplifier arrangement 100, 200 according to embodiments herein may be employed in various integrated circuits, e.g. monolithic integrated circuits, electronic devices or communication devices, such as radio transmitters, radio base stations, mobile stations, beamforming antenna arrays. FIG. 9 shows a block diagram of a general electronic device 900, which may be, e.g. an integrated circuit, a mobile station, a radio base station or a beamforming antenna array, in which the amplifier arrangement 100, 200 according to embodiments herein may be implemented. The electronic device 900 may comprise a transceiver 930 comprising a receiver 910 and a transmitter 920 and a processing unit 940 etc. The transmitter 920 may comprise the amplifier arrangement 100, 200.

The embodiments herein are not limited to the above described preferred embodiments. Various alternatives, modifications and equivalents may be used. When using the word "comprise" or "comprising" it shall be interpreted as non-limiting, i.e. meaning "consist at least of". Therefore, the above embodiments should not be taken as limiting the scope of the invention, which is defined by the appending claims.

The invention claimed is:

1. An amplifier arrangement for amplifying an input signal to an output signal for delivering to a load, the amplifier arrangement comprising:
a power splitter configured to receive the input signal and produce split input signals;
a first amplifier branch comprising multiple main amplifier circuits, wherein each of the multiple main amplifier circuits is configured to receive one of the split input signals from the power splitter and to generate an output signal, wherein the output signals of the multiple main amplifier circuits are combined to generate a first output signal, and wherein each of the multiple main amplifier circuits comprises a bipolar or field-effect transistor, and a base of each bipolar transistor or a gate of each field-effect transistor is biased separately;
a second amplifier branch comprising at least one auxiliary amplifier circuit each being selectively operable to operate in combination with the multiple main amplifier circuits, and wherein the at least one auxiliary amplifier circuit is configured to receive one of the split input signals from the power splitter and produce a second output signal;
a power combiner configured to receive the first and second output signals and produce the output signal for delivering to the load; and
a bias control circuit configured to adapt bias voltages for the transistors comprised in the multiple main amplifier circuits based on temperature;
wherein the power splitter is configured to unevenly split power of the input signal to produce the split input signals with different power to the main and the auxiliary amplifier circuits, and
wherein each of the multiple main amplifier circuits is configured to receive a different split input signal from the power splitter.

2. The amplifier arrangement according to claim 1, wherein emitter areas of the bipolar transistors comprised in the multiple main amplifier circuits, or gate peripheries of the field-effect transistors comprised in the multiple main amplifier circuits are configured in combination with their respective base or gate biases such that a combined nonlinearity coefficient of the transistors comprised in the multiple main amplifier circuits is minimized.

3. The amplifier arrangement according to claim 1, wherein the second amplifier branch further comprises a second auxiliary amplifier circuit configured to receive one of the split input signals from the power splitter and produce a third output signal.

4. The amplifier arrangement according to claim 1, wherein the power combiner comprises any one of a quarter-wavelength transmission line, a Branch-line coupler, a lumped elements coupler, a coupled-line coupler, a Lange coupler or 3-dB quadrature hybrid combiner.

* * * * *